(12) United States Patent
Nakashima et al.

(10) Patent No.: US 7,741,558 B2
(45) Date of Patent: Jun. 22, 2010

(54) SOLAR CELL MODULE

(75) Inventors: Takeshi Nakashima, Kobe (JP); Eiji Maruyama, Katano (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 251 days.

(21) Appl. No.: 11/826,719

(22) Filed: Jul. 18, 2007

(65) Prior Publication Data
US 2008/0023068 A1 Jan. 31, 2008

(30) Foreign Application Priority Data
Jul. 20, 2006 (JP) ............... 2006-198721

(51) Int. Cl.
*H01L 31/02* (2006.01)
(52) U.S. Cl. .................................... 136/256
(58) Field of Classification Search ................ 136/244, 136/249, 251, 252, 256, 258, 259, 261
See application file for complete search history.

(56) References Cited

U.S. PATENT DOCUMENTS

| 5,718,773 | A | 2/1998 | Shiozaki | |
|---|---|---|---|---|
| 6,388,301 | B1 | 5/2002 | Tawada et al. | |
| 2004/0013899 | A1 | 1/2004 | Abe | |
| 2005/0126625 | A1* | 6/2005 | Yamamoto et al. | 136/256 |

FOREIGN PATENT DOCUMENTS

| EP | 1 542 290 A1 | 6/2005 |
|---|---|---|
| JP | 06-318724 A | 11/1994 |
| JP | 7-83131 B2 | 9/1995 |
| JP | 07-278791 | 10/1995 |
| JP | 2002-335003 A | 11/2002 |
| JP | 2004-221368 A | 8/2004 |
| JP | 2005-175160 | 6/2005 |
| JP | 2005-217148 A | 8/2005 |
| JP | 2005-268239 A | 9/2005 |
| WO | 02/04761 A1 | 1/2002 |

OTHER PUBLICATIONS

Official Action Letter issued on May 9, 2008 in the counterpart Japanese patent application.

* cited by examiner

*Primary Examiner*—Jessica L Ward
*Assistant Examiner*—Kevin E Yoon
(74) *Attorney, Agent, or Firm*—Marvin A. Motsenbocker; Mots Law, PLLC (57) ABSTRACT

A solar cell module includes a photovoltaic element, a light receiving surface side protective member disposed above a light receiving surface of the photovoltaic element, and a back surface side protective member disposed above a back surface opposite to the light receiving surface side of the photovoltaic element. The photovoltaic element includes an indium oxide layer formed on a surface facing the back surface side protective member and another indium oxide layer formed on a surface facing the light receiving surface side protective member. An arithmetic mean roughness (Ra) on a surface of the indium oxide layer on the back surface of the photovoltaic element is larger than an arithmetic mean roughness (Ra) on the light receiving surface of the photovoltaic element.

4 Claims, 5 Drawing Sheets

SOLAR CELL MODULE

CROSS REFERENCE TO RELATED APPLICATIONS

This application is based upon and claims the benefit of priority from prior Japanese Patent Application No. 2006-198721, filed on Jul. 20, 2006; the entire contents of which are incorporated herein by reference.

BACKGROUND OF THE INVENTION

1. Field of the Invention

The present invention relates to a solar cell module which includes a photovoltaic element, a light receiving surface side protective member disposed above a light receiving surface of the photovoltaic element, and a back surface side protective member disposed above a back surface opposite to the light receiving surface of the photovoltaic element.

2. Description of the Related Art

Heretofore, a photovoltaic element, which includes a transparent conductive film formed of indium oxide layers, is known. For such an indium oxide layer, ITO (Indium Tin Oxide) being $In_2O_3$ to which $SnO_2$ is added as impurities has been widely used because of its high conductivity and of good workability.

When using the above-described ITO as a transparent conductive film, it is known that the arithmetic mean roughness (Ra) of an ITO surface is made small so that it is 2.0 nm or less, to maintain low resistance and low light absorption (refer to, for example, Japanese Patent Application Laid-open Publication No. 2005-175160).

Further, a technology is disclosed in which, by using an indium oxide layer to which tungsten (W) is added as impurities, resistance and light absorption lower than those of the ITO can be maintained (refer to, for example, Japanese Patent Application Laid-open Publication No. H7-278791).

As described above, on the indium oxide layer, many trials have been conducted to achieve low resistance and high light transmittance.

On the other hand, when mounting a photovoltaic element on a solar cell module, there is high possibility that it is open to the outside air for a long period. However, no study has been made on weather resistance such as moisture resistance under the above condition. Particularly, when using a film as the back surface side protective member disposed above a back surface of a photovoltaic element, the entering of moisture due to deterioration of the film is considered. Accordingly, it is desired that a photovoltaic element having excellent moisture resistance be developed.

SUMMARY OF THE INVENTION

An aspect of the present invention is the provision of a solar cell module which includes a photovoltaic element, a light receiving surface side protective member disposed above a light receiving surface of the photovoltaic element, and a back surface side protective member disposed above a back surface opposite to the light receiving surface of the photovoltaic element, and in which the photovoltaic element includes a first transparent conductive film formed on a first surface facing the back surface side protective member and a second transparent conductive film formed on a second surface facing the light receiving surface side protective member; and an arithmetic mean roughness on a surface of the first transparent conductive film is larger than an arithmetic mean roughness on a surface of the second transparent conductive film.

According to the solar cell module of the above-described invention, the arithmetic mean roughness of the first transparent conductive film disposed above the back surface side protective member of the photovoltaic element is made larger than that of the second transparent conductive film disposed above the light receiving surface side protective member, so that a weather resistance on the side of the first transparent conductive film can be increased than that on the side of the second transparent conductive film. It is therefore possible to reduce an influence of moisture on a property of the photovoltaic element, the moisture permeating through the back surface side protective member and entering the solar cell module. The arithmetic mean roughness of the second transparent conductive film disposed above the side of the light receiving surface side protective member can be made smaller than that of the first transparent conductive film disposed above the side of the back surface side protective member, so that the light transmittance and conductivity of the second transparent conductive film can be more enhanced than those of the first transparent conductive film. Thus, light which permeates through the light receiving surface side protective member and which enters the solar cell module can be effectively brought into the photovoltaic element, and concurrently a resistance loss can be also made small which loss occurs when taking out a light generation carrier generated in the photovoltaic element through the second transparent conductive film. As described above, a solar cell module having a high output and an excellent weather resistance can be provided.

In a solar cell module of another aspect of the present invention, it is preferable that a main constituent of the first transparent conductive film be indium oxide.

According to the above-described solar cell module, a further enhancement of the weather resistance can be achieved by using the indium oxide that is not easily dissolved into water.

In a solar cell module of another aspect of the present invention, it is preferable that the arithmetic mean roughness (Ra) on the surface of the first transparent conductive film be 0.5 nm or more.

According to the above-described solar cell module, an excellent weather resistance can be obtained.

In a solar cell module of still another aspect of the present invention, it is preferable that the first transparent conductive film be formed of indium oxide to which tungsten is added and that the arithmetic mean roughness (Ra) on the surface of the first transparent conductive film be 1.0 nm or less.

According to the above-described solar cell module, since the first transparent conductive film is formed of tungsten doped indium oxide tungsten, the arithmetic mean roughness (Ra) can made small, and additionally since the arithmetic mean roughness (Ra) is 1.0 nm or less, the conductivity and light transmittance along with the weather resistance can be enhanced.

In a solar cell module of a still further aspect of the present invention, it is preferable that the second transparent conductive film be formed of indium oxide to which tungsten is added and that the arithmetic mean roughness (Ra) on the surface of the second transparent conductive film be 0.5 nm or less.

According to the above-described solar cell module, since the second transparent conductive film is formed of indium oxide to which tungsten is added, the arithmetic mean roughness (Ra) can made small, and additionally since the arithmetic mean roughness (Ra) is 0.5 nm or less, the conductivity and light transmittance can be further enhanced.

In a solar cell module of a still yet further aspect of the present invention, it is preferable that: the photovoltaic element further includes a one-conductive type crystalline semiconductor layer, a first substantially intrinsic amorphous semiconductor layer which is formed on a surface of the crystalline semiconductor layer and an other-conductive type amorphous semiconductor layer which is formed on another surface of the crystalline semiconductor layer, and a second substantially intrinsic amorphous semiconductor layer which is formed on another surface of the crystalline semiconductor layer and a one-conductive type amorphous semiconductor layer which is formed on the second substantially intrinsic amorphous semiconductor layer; and that the first transparent conductive film is formed on either the other-conductive type amorphous semiconductor layer or the one-conductive type second amorphous semiconductor layer. Here, the "amorphous semiconductor layer" contains not only amorphous but also crystal particles layers. For example, its concept is to also contain a microcrystal semiconductor.

According to the above-described solar cell module, the amorphous semiconductor layer exists between the crystalline semiconductor layer and the first transparent conductive film, so that the first transparent conductive film is formed without being influenced by the orientation of the crystalline semiconductor layer. Thus, the arithmetic mean roughness (Ra) of the first transparent conductive film is optimally controlled, and the first transparent conductive film having excellent conductivity and light transmittance can be easily obtained.

BRIEF DESCRIPTION OF THE DRAWINGS

FIG. 9 is a view showing a relationship between $I_{sc} \times F.F.$ and an arithmetic mean roughness (Ra) on the surface of the transparent conductive film formed on the back surface of the photovoltaic element according to the example.

DETAILED DESCRIPTION OF THE PREFERRED EMBODIMENTS

Hereinafter, a embodiment of the present invention will be described by using the drawings. In the following description of the drawings, the same or similar reference numerals are given to the same or similar components. It should be noted that the drawings are schematic ones, each dimensional ratio or the like shown in the drawings are different from those of actual ones. For this reason, specific dimensions or the like should be determined with reference to the following description. Moreover, as a matter of course, the drawings include part where there are differences among the drawings in terms of dimensional relationships and ratios.

(Solar Cell Module)

Figure 1:
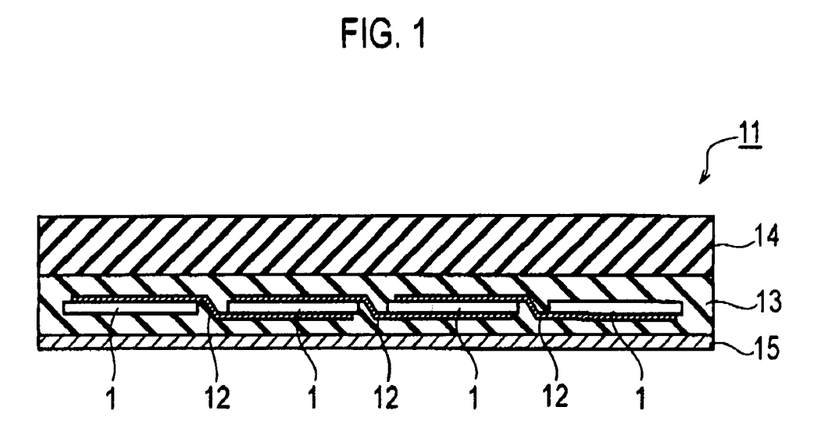
FIG. 1 is a sectional view for showing a configuration of a solar cell module according to the embodiment.

A solar cell module 11 according to the embodiment includes a plurality of photovoltaic elements 1 as shown in FIG. 1. Above a light receiving surface of the photovoltaic element 1, a light receiving surface side protective member 14 is disposed. Above a back surface opposite to the light receiving surface of the photovoltaic element 1, a back surface side protective member 15 is disposed.

Each one of the plurality of photovoltaic elements 1 is electrically connected to one another with a flat tab 12 formed of copper foil. The tab 12 is connected at one end-side thereof to an electrode 6 (refer to FIG. 2) formed on the light receiving surface of a predetermined photovoltaic element 1. The tab 12 is connected at the other end-side to an electrode 10 (refer to FIG. 2) formed on the back surface of another photovoltaic element 1 adjacent to the predetermined photovoltaic element 1. Further, the plurality of photovoltaic elements 1, which are connected with the tabs 12, are covered with the sealing material 13 made of EVA (Ethylene Vinyl Acetate).

The light receiving surface side protective member 14 is disposed on the light receiving surface of the sealing material 13. The light receiving surface side protective member 14 is constituted by a transparent member such as a glass substrate or a plastic plate.

The back surface side protective member 15 is disposed on the back surface of the sealing material 13. The back surface side protective member 15 is formed from a resin film or a laminated body including a resin film and a metal foil. The laminated body can be, for example, constituted by a triplex structure of PET (Poly Ethylene Terephtalate)/aluminum foil/PET.

(Photovoltaic Element)

Figure 2:
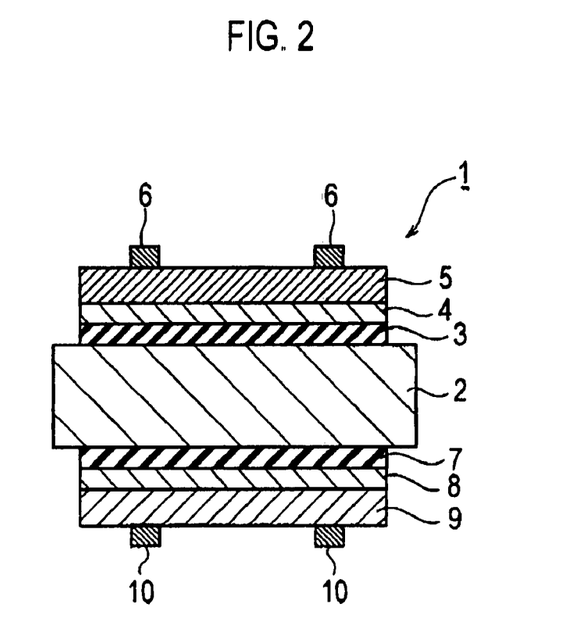
FIG. 2 is a sectional view for showing a configuration of a photovoltaic element according to the embodiment.
Figure 3:
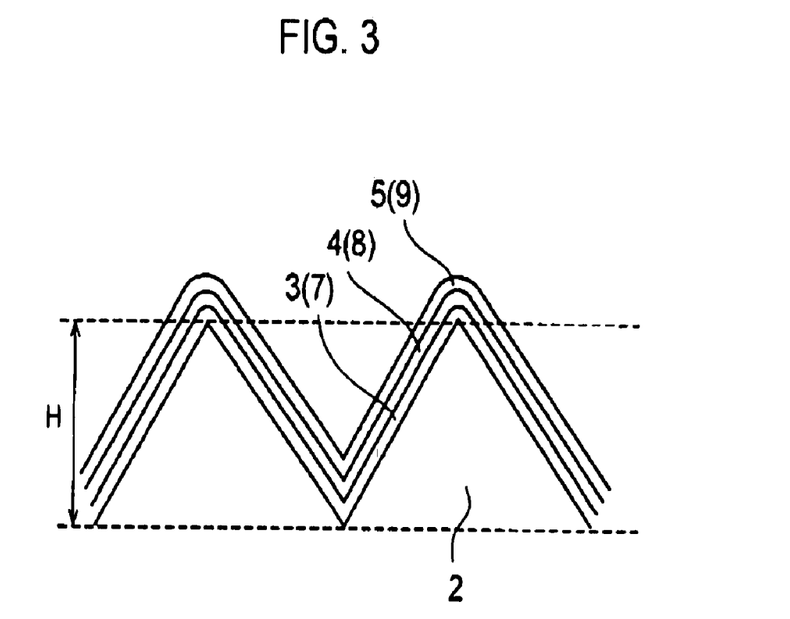
FIG. 3 is an enlarged sectional view for showing a structure of a single crystal silicon substrate in the vicinity of a surface thereof.
Figure 4:
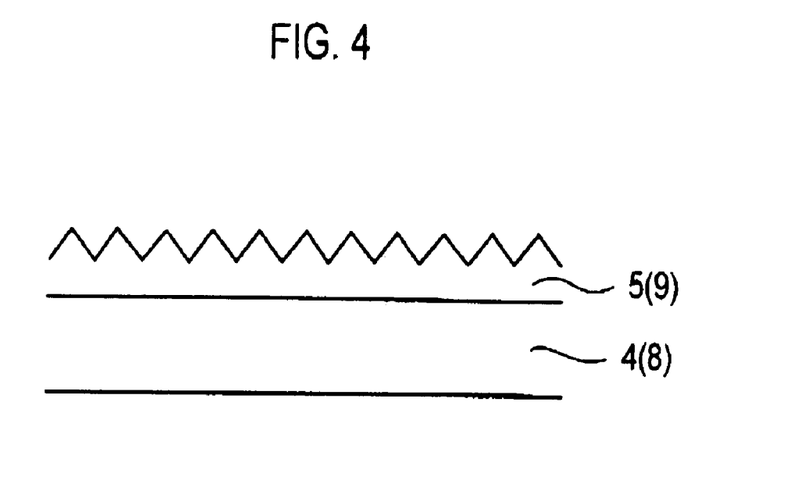
FIG. 4 is an enlarged sectional view for showing a structure of a transparent conductive film shown in FIG. 2.

Next, a configuration of the photovoltaic element according to the present embodiment is described with reference to FIGS. 2 to 4. A photovoltaic element shown in FIG. 2 is depicted in the same direction as that of the photovoltaic element 1 shown in FIG. 1, and a top face side of FIG. 1 is the light receiving surface side. The present embodiment is described using a photovoltaic element having an HIT (Heterojunction with Intrinsic Thin-layer) structure as an example.

The photovoltaic element 1 according to the present embodiment includes an n-type single crystal silicon substrate 2 having an electrical resistivity of approximately 1 $\Omega \cdot cm$ and a thickness of approximately 200 μm, as shown in FIG. 2. Incidentally, the n-type single crystal silicon substrate 2 is an example of a "crystalline semiconductor layer" of the present invention. Further, as shown in FIG. 3, on a surface (a light receiving surface and a back surface) of the n-type single crystal silicon substrate 2, Pyramid-like asperities having heights H of several micrometers to several tens of micrometers are formed.

On the light receiving surface of the n-type single crystal silicon substrate 2, a substantially intrinsic (i-type) amorphous silicon layer 3 having a thickness of roughly 5 nm is formed. Incidentally, this i-type amorphous silicon layer 3 is an example of a "first substantially intrinsic amorphous semiconductor layer" of the present invention.

Further, on a light receiving surface of the i-type amorphous silicon layer 3, a p-type amorphous silicon layer 4 having a thickness of approximately 5 nm is formed.

Further, on a light receiving surface of the p-type amorphous silicon layer 4, an indium oxide layer 5 having a thickness of approximately 100 nm is formed. Incidentally, the indium oxide layer 5 is an example of the "second transparent conductive film" of the present invention.

Still further, the indium oxide layer 5 is formed of indium oxide to which tungsten is added. As shown in FIG. 4, on a light receiving surface of the indium oxide layer 5, asperities are formed. Because of the asperities, the light receiving surface of the indium oxide layer 5 has an arithmetic mean roughness (Ra) which is approximately 0.5 nm or less. The arithmetic mean roughness (Ra) is defined by the Japanese Industrial Standards (JIS B 0601-1994).

On a predetermined area of the light receiving surface of the indium oxide layer 5, a comb-like electrode 6 is formed. The electrode 6 is formed of silver (Ag) and resin binder. In addition, the resin binder constituting the electrode 6 contains epoxy resin. The content of the epoxy resin in the resin binder is in the range of approximately 60 percent by mass to approximately 100 percent by mass.

On the back surface of the n-type single crystal silicon substrate 2, a substantially intrinsic (i-type) amorphous silicon layer 7 having a thickness of approximately 5 nm is formed. The i-type amorphous silicon layer 7 is an example of a "second substantially intrinsic amorphous semiconductor layer" of the present invention.

Further, on a back surface of the i-type amorphous silicon layer 7, an n-type amorphous silicon layer B having a thickness of approximately 5 nm is formed. As described above, on the back surface of the n-type single crystal silicon substrate 2, the i-type amorphous silicon layer 7 and the n-type amorphous silicon layer 8 are formed in sequence, whereby a structure so-called a BSF (Back surface Field) structure is formed.

Further, on a back surface of the n-type amorphous silicon layer 8, an indium oxide layer 9 having a thickness of approximately 100 nm is formed. Incidentally, the indium oxide layer 9 is an example of the "first transparent conductive film" of the present invention. Further, the indium oxide layer 9 is formed of indium oxide to which tungsten is added. As shown in FIG. 4, on a back surface of the indium oxide layer 9, asperities are formed. Because of the asperities, the back surface of the indium oxide layer 9 has an arithmetic mean roughness (Ra) which is from approximately 0.5 nm to approximately 1.0 nm.

On a predetermined area of the back surface of the indium oxide layer 9, a comb-like electrode 10 is formed. The electrode 10 is formed of electrically conductive paste.

Further, configurations except the above-mentioned configurations of the i-type amorphous silicon layer 7, the n-type amorphous silicon layer 8, the indium oxide layer 9, and the electrode 10 formed on the back surface of the n-type single crystal silicon substrate 2 are the same as configurations of the i-type amorphous silicon layer 3, the p-type amorphous silicon layer 4, the indium oxide layer 5, and the electrode 6 formed on the light receiving surface of the n-type single crystal silicon substrate 2.

Further, in the present embodiment, the arithmetic mean roughness on the surface of the indium oxide layer 9 is larger than that on the surface of the indium oxide layer 5.

(Operation and Effect)

The photovoltaic element 1 of the present embodiment includes the indium oxide layer 9 formed on the surface facing the back surface side protective member 15, and the indium oxide layer 5 formed on the surface facing the light receiving surface side protective member 14; and the arithmetic mean roughness (Ra) on the surface of the indium oxide layer 9 is larger than the arithmetic mean roughness (Ra) on the surface of the indium oxide layer 5.

For a conventional photovoltaic element, a transparent conductive film having a small arithmetic mean roughness (Ra) has been studied in order to simultaneously have two characteristics of high light transmittance and low resistance. On the other hand, the photovoltaic element 1 of the present embodiment is equipped with the indium oxide layer 9 having intentionally a large arithmetic mean roughness (Ra). It is, therefore, possible to suppress the reduction of the adhesiveness between the indium oxide layer 9 and the electrode 10 caused by the filtering of moisture into a contacting interface between them, the moisture transmitting the back surface side protective member 15 and entering the solar cell module 11. As a result, a solar cell module having an excellent weather resistance can be provided.

Further, since the arithmetic mean roughness on the surface of the indium oxide layer 5 can be made small as in the past, two characteristics of high transmittance and low resistance can be maintained at the same time. Therefore, it is possible to cause light to effectively transmit the photovoltaic element 1 and reduce resistance loss occurring when taking out photogenerated carriers generated in the photovoltaic element 1. As a result, a solar cell module having excellent output characteristics can be provided.

Further, when the arithmetic mean roughness (Ra) on the surface of the indium oxide layer 9 is from 0.5 nm to 1.0 nm, low resistance and high light transmittance along with the weather resistance can be simultaneously improved. In the same manner as above, when the arithmetic mean roughness (Ra) on the surface of the indium oxide layer 5 is 0.5 nm or less, conductivity and light transmittance can be, further, improved.

Further, the weather resistance of the indium oxide layer 9 formed on the back surface of the photovoltaic element 1 can be, further, improved since indium oxide not easily dissolved into water is used as a major constituent.

Further, since main constituents of the indium oxide layer 9 formed on the back surface of the photovoltaic element 1 and the indium oxide layer 5 formed on the light receiving surface of the photovoltaic element 1 are indium oxide to which tungsten is added, the arithmetic mean roughness (Ra) on surfaces thereof can be made small.

The photovoltaic element 1 of the present embodiment includes the n-type single crystal silicon substrate 2, the i-type amorphous silicon layer 7 and the n-type amorphous silicon layer 8, which are arranged in this sequence, and the indium oxide layer 9 is formed on the back surface of the n-type amorphous silicon layer 8. In this manner, the i-type amorphous silicon layer 7 and the n-type amorphous silicon layer 8 exist between the indium oxide layer 9 and the n-type single crystal silicon substrate 2. Accordingly, it is possible to control the arithmetic mean roughness (Ra) on the surface of the indium oxide layer 9 without being influenced by the orientation of the single crystal silicon substrate 2. Thus, the indium oxide layer 9, conductivity and light transmittance of which are improved, can be easily formed with a good yield.

Further, as described later, in a method of manufacturing the photovoltaic element 1 of the present embodiment, pressure of a mixed gas containing at least oxygen is adjusted, so it is possible to form the indium oxide layer 9 having an arithmetic mean roughness (Ra) of 0.5 nm or less. Heretofore, it has been difficult to adjust the arithmetic mean roughness (Ra) to be 0.5 nm or less, and confirmation of data about 0.5 nm or less has not been made. In the present embodiment, since pressure of a mixed gas used when forming the indium oxide layer 9 is adjusted, the arithmetic mean roughness (Ra) on the surface of the indium oxide layer 9 can be adjusted to be 0.5 nm or less. Consequently, reliable data can be secured. Data are referred to the example to be described later.

(Method of Manufacturing Photovoltaic Element)

A method of manufacturing a photovoltaic element 1 according to the present embodiment is described below with reference to FIGS. 5 and 6.

Figure 5:
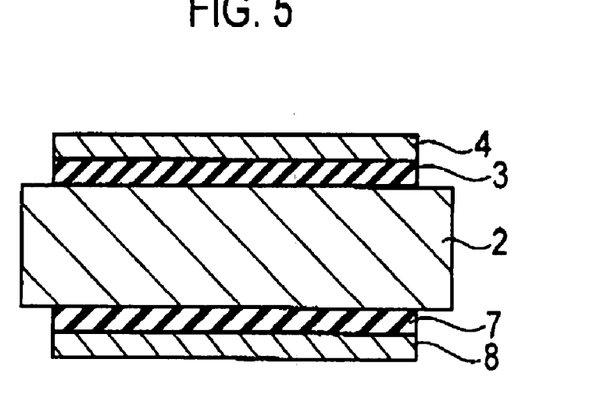
FIG. 5 is a sectional view for illustrating a manufacturing method of the solar cell module according to the embodiment (Part 1)

First, as shown in FIG. 5, an n-type single crystal silicon substrate 2 having a resistance of 1 Ω·cm and a thickness of 300 μm is cleaned to remove impurities, and a texture structure is formed on the surface of the n-type single crystal silicon substrate 2 by etching.

Next, using an RF plasma CVD method, an i-type amorphous silicon layer 3 having a thickness of approximately 5 nm and a p-type amorphous silicon layer 4 having a thickness of approximately 5 nm are formed in this sequence on the light receiving surface of the n-type single crystal silicon substrate 2.

Further, specific conditions of forming the i-type amorphous silicon layer 3 and the p-type amorphous silicon layer 4 by the RF plasma CVD method are given as follows: frequency=13.56 MHz; forming temperature=100 to 300 degrees Celsius; reaction pressure=5 to 100 Pa and RF power=1 to 500 W/cm$^2$. As p-type dopant, B, Al, Ga, In and the like being III-group elements are cited. Chemical compound gas containing at least one of the above-described elements is mixed in source gas such as SiH$_4$, whereby a conductivity type of the amorphous silicon can be made of p-type by controlling a valency electron.

Next, an i-type amorphous silicon layer 7 having a thickness of approximately 5 nm and an n-type amorphous silicon layer 8 having a thickness of approximately 5 nm are formed in this sequence on the back surface of the n-type single crystal silicon substrate 2.

Further, the i-type amorphous silicon layer 7 and the n-type amorphous silicon layer 8 are respectively formed in the same processes as those used for the i-type amorphous silicon layer 3 and the p-type amorphous silicon layer 4. Further, as n-type dopant, P, N, As, Sb and the like being V-group elements are cited. Chemical compound gas containing at least one of the above-described elements is mixed in source gas such as SiH$_4$, whereby a conductivity type of the amorphous silicon can be made of n-type by controlling a valency electron.

Incidentally, as methods of forming an amorphous silicon layer, known methods such as an evaporation method, a sputtering method, a microwave plasma CVD method, an ECR method, a thermal CVD method and an LPCVD method can be used. Further, as an amorphous silicon layer, Si, SiGe, SiGeC, SiC, SiN, SiGeN, SiSn, SiSnN, SiSnO and the like are used, which each are amorphous or microcrystal containing at least one of hydrogen and fluorine.

Figure 6:
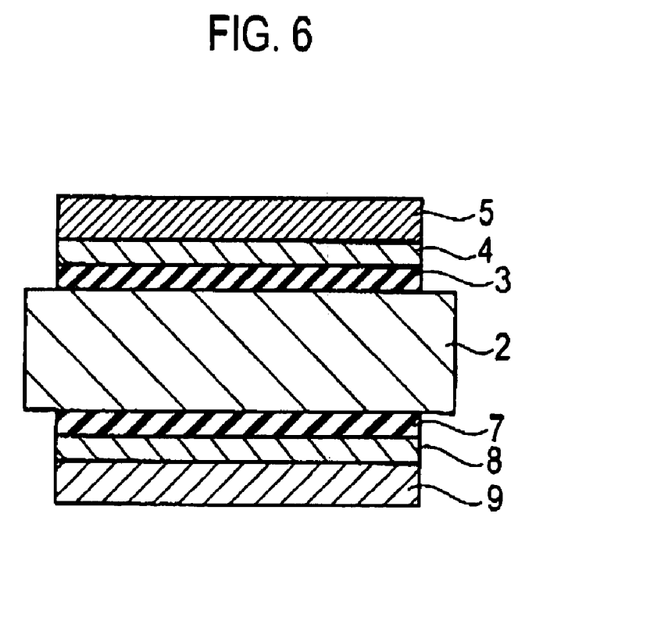
FIG. 6 is a sectional view for illustrating a manufacturing method of the solar cell module according to the embodiment (Part 2)

Subsequently, as shown in FIG. 6, on the light receiving surface of the p-type amorphous silicon layer 4 and on the back surface of the n-type amorphous silicon layer 8, indium oxide layers 5 and 9 each having a thickness of 30 to 100 nm are respectively formed. To be more precise, a sintered body of In$_2$O$_3$ powder in which 3 weight percent of WO$_3$ powder is mixed is used as a target, whereby the indium oxide layers 5 and 9 are formed by an ion plating method. The conditions of the forming are that a mixed gas of Ar and O$_2$ is caused to flow and pressure is maintained at 1.2 to 2.0 Pa. The partial pressure of Ar is constant at 1.0 Pa. Other than Ar, inactive gases such as He, Ne, Kr and Xe, or a mixed gas of these inactive gases can be also used.

Here, pressure is controlled so that the arithmetic mean roughness (Ra) on surfaces of the indium oxide layers 5 and 9 is adjusted. For example, when forming the indium oxide layer 5 having a thickness of 100 nm with pressure maintained at 1.3 to 1.7 Pa, the arithmetic mean roughness (Ra) on the surface of the indium oxide layer 5 is 0.5 or less. Further, when forming the indium oxide layer 9 having a thickness of 100 nm with pressure maintained at 1.7 to 1.8 Pa, the arithmetic mean roughness (Ra) on the surface of the indium oxide layer 9 is from 0.5 to 1.0 nm.

Further, the indium oxide layers 5 and 9 can be formed by a sputtering method. At this time, as in the case of the ion plating method, it is preferable that ion energy entering the n-type single crystal silicon substrate 2 be sufficiently reduced so that it is 100 eV or less. For example, it is preferable that the indium oxide layers 5 and 9 are formed by using an RF sputtering method in which a magnetic field of 3000 Gauss or more is applied.

Next, on the light receiving surface of the indium oxide layer 5 and on a predetermined area of the back surface of the indium oxide layer 9, Ag paste in which silver (Ag) is kneaded in epoxy resin is formed in a height of 10 to 30 μm and in a width of 100 to 500 μm. The Ag paste is, thereafter, burned at 200 degrees Celsius for eighty minutes so that it is cured. Thus, the electrodes 6 and 10 are formed. The electrodes 6 and 10 each include a comb-like collector electrode having a plurality of branches being parallel to each other, and a bus bar electrode collecting electric flowing in the comb-like collector electrode.

In this way, the photovoltaic element 1 of the present embodiment shown in FIG. 2 is fabricated.

(Manufacturing Method of Solar Cell Module)

Next, a plurality of photovoltaic elements 1 fabricated in the above-described method are prepared.

Subsequently, a tab 12 (refer to FIG. 1) formed of copper foil is connected at one end-side thereof to an electrode 6 on the light receiving surface of the photovoltaic element 1. Connecting of the tab 12 to the electrode 6 is made in such a way that solder coated on a surface of the tab 12 is heated so that the electrode 6 and the tab 12 are soldered. Further, the tab 12 is connected at the other end-side to an electrode 10 (refer to FIG. 2) on the back surface of another neighboring photovoltaic element 1.

Next, the sealing material 13 formed from an EVA sheet is put on the light receiving surface side protective member 14 formed from a glass substrate, and, thereafter, the plurality of photovoltaic elements 1 connected to each other with the tabs 12 are put thereon. Thereafter, the sealing material 13 formed from an EVA sheet is, further, put thereon, and, subsequently, the back surface side protective member 15 formed of PET is put thereon. That is, the back surface side protective member 15 is disposed on a side on which an indium oxide layer 9, the arithmetic mean roughness (Ra) on the surface thereof being from 0.5 nm to 1.0 nm, is formed, and a light receiving surface side protective member 14 is disposed on a side on which an indium oxide layer 5, the arithmetic mean roughness (Ra) on the surface thereof being 0.5 nm or less, is formed.

Thereafter, the light receiving surface side protective member 14, the sealing material 13, the plurality of photovoltaic elements 1 which are connected to each other with the tabs 12 and the back surface side protective member 15, are integrated with under pressure while being heated.

In this way, the solar cell module 11 of the present embodiment shown in FIG. 1 is formed.

Other Embodiment

Although the present invention is described using the above-described embodiment, it is to be understood that the present invention is not limited to description and drawings constituting part of this disclosure. From this disclosure, various embodiments and the operations thereof will be obvious to those skilled in the art.

For example, although the above-described embodiment is described for the case where a photovoltaic body formed from an n-type single crystal silicon substrate is used, a photovoltaic body formed from a p-type single crystal silicon substrate may be used.

For example, the same effect can be obtained even when applying the present invention to a photovoltaic element in which a pn junction is formed by directly connecting a single crystal or polycrystal semiconductor substrate having a one-conductive type and an amorphous semiconductor having an other conductive type, a photovoltaic element in which a pn junction is formed by forming an other type area on a surface of a single crystal or polycrystal semiconductor substrate having a one-conductive type using a thermal diffusion method or the like, and the like.

Further, although the above-described embodiment is described using a photovoltaic element with an HIT structure as an example, the same effect can be obtained even when the present invention is applied to a photovoltaic element having no HIT structure.

Further, as a transparent conductive film, although an indium oxide film added with tungsten is used, the present invention is not limited to this case, and an indium oxide layer added with another material may be used. For example, materials such as Sn, Mo, Ti, Si, As, Ca, Cu, F, Ge, Mg, S, and Zn may be added, or a plurality of these materials may be added.

Further, a material for forming the transparent conductive film is not limited to an indium oxide film, and, alternatively, another material such as a zinc oxide film or a tin oxide film may be used.

As described above, various embodiments not described in this application are also included in the scope of the present invention. Accordingly, the scope of the present invention is defined by the appended claims rather than by the forgoing description.

Example

Although a photovoltaic element according to the present invention is specifically described below with reference to an example, the present invention is not limited to the following example, and various changes may be made therein without departing from the spirit of the present invention.

(Relationship Between Arithmetic Mean Roughness and Pressure)

First, to investigate a relationship between pressure of forming an indium oxide layer and an arithmetic mean roughness (Ra), pressure applied when forming an indium oxide layer is changed, and the arithmetic mean roughness (Ra) on a surface of the indium oxide layer is measured. To be more precise, a sintered body of $In_2O_3$ powder in which 3 weight percent of $WO_3$ powder is mixed is used as a target, whereby an indium oxide layer is formed on a mirror silicon substrate by an ion plating method. In this manner, the mixing-in of the $WO_3$ powder enables the value of Ra to be smaller than that obtained when mixing $SnO_2$ or the like. Under the condition of forming that a mixed gas of Ar and $O_2$ is caused to flow and pressure is changed from 1.6 Pa to 2.0 Pa, an indium oxide layer of a thickness of 30 nm is formed, and the arithmetic mean roughness (Ra) on a surface of the indium oxide layer is measured. Further, while changing pressure from 1.2 to 2.0 Pa, a indium oxide layer having a thickness of 100 nm is formed, and the arithmetic mean roughness (Ra) on a surface of the indium oxide layer is measured. Incidentally, the arithmetic mean roughness (Ra) was measured using an AFM (nanoscope IIIa manufactured by Nihon Veeco K.K.) according to the Japanese Industrial Standards (JIS B 0601-1994).

Figure 7:
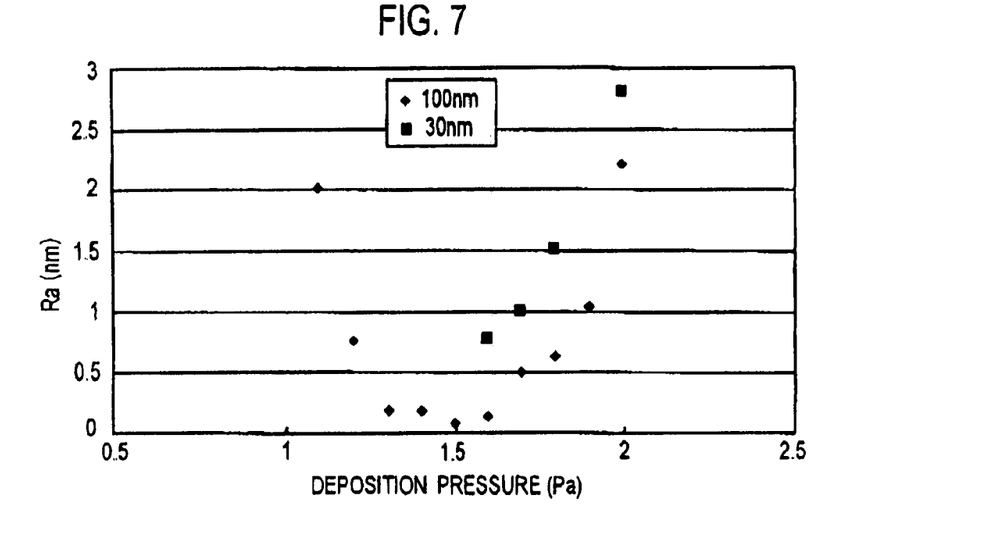
FIG. 7 is a view for illustrating a relationship between an arithmetic mean roughness (Ra) on a surface of the transparent conductive film and pressure thereof according to the example.

Obtained results are shown in FIG. 7. As shown in FIG. 7, it was found out that the arithmetic mean roughness (Ra) on a surface of the indium oxide layer can be controlled by pressure. Further, as shown in FIG. 7, it was found out that, for indium oxide layers each having a thickness of 100 nm formed under pressures of 1.3 to 1.7 Pa, the arithmetic mean roughness (Ra) on a surface of the indium oxide layer is 0.5 nm or less. In addition, it was found out that, for indium oxide layers each having a thickness of 100 nm formed under pressures of 1.7 to 1.8 Pa, the arithmetic mean roughness (Ra) on a surface of the indium oxide layer is from 0.5 nm to 1.0 nm.

Further, it can be seen that an indium oxide layer having a thickness of 30 nm tends to have larger arithmetic mean roughness (Ra) than an indium oxide layer having a thickness of 100 nm, namely it was found out that thinning of a film causes the arithmetic mean roughness (Ra) to be larger.

Incidentally, a specific resistance of this indium oxide layer is from $3 \times 10^{-4}$ to $8 \times 10^{-4}$ $\Omega$cm.

(Evaluation of Arithmetic Mean Roughness (Ra) on a Surface of a Transparent Conductive Film on a Back Surface Side)

Next, a transparent conductive film (the indium oxide layer 5 of FIG. 2) on a light receiving surface side is made under conditions (a thickness of 100 nm under 1.5 Pa) under which the arithmetic mean roughness (Ra) of a surface attains a minimum value in FIG. 7, and the arithmetic mean roughness (Ra) on a surface of a transparent conductive film (the indium oxide layer 9 of FIG. 2) on the back surface side is changed, thereby forming a sample.

Here, the solar cell module 11 having the structure shown in FIG. 1 is made for each sample, and weather resistance is evaluated. The weather resistance is evaluated in terms of a rate of change (an output after 2000 hours have elapsed/an initial output) of an output (Pmax) before or after 2000 hours have elapsed under the conditions that temperature is 85 degrees Celsius and humidity is 85 percent.

Figure 8:
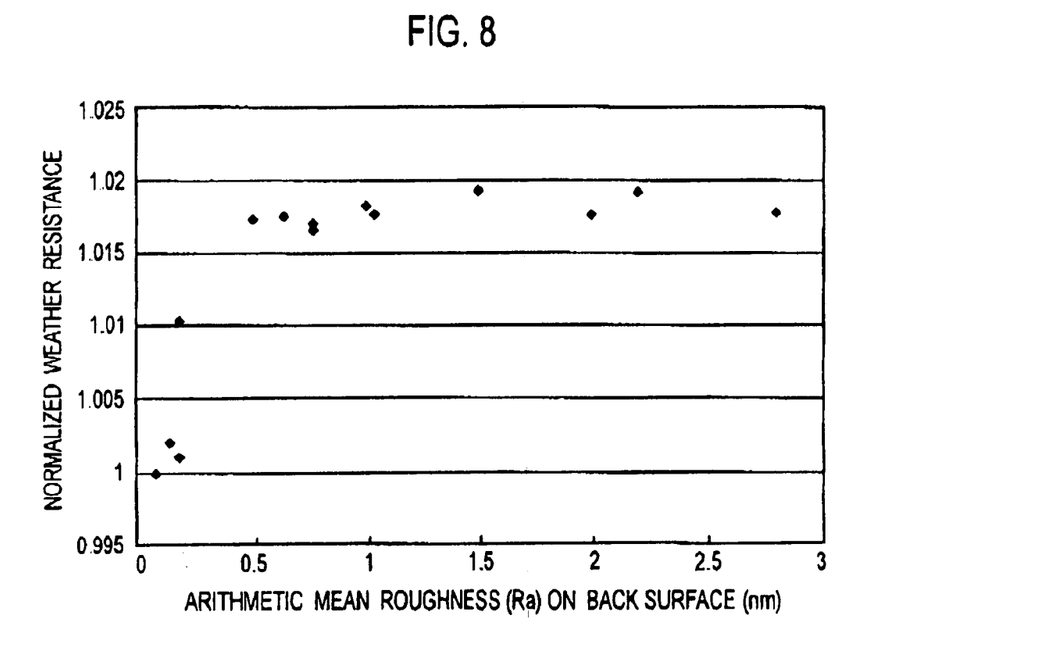
FIG. 8 is a view for showing a relationship between normalized weather resistance and an arithmetic mean roughness (Ra) on the surface of the transparent conductive film formed on the back surface of the photovoltaic element according to the example.

Results are shown in FIG. 8. In FIG. 8, a weather resistance obtained under the condition that the lowest Ra of the transparent conductive film on the back surface side is set as 1, and the weather resistance is normalized and shown. Further, as the back surface side protective member, a back surface side protective film having a water vapor permeability of 0.3 ($g/m^2$*day) is used, so that the back surface side protective film has a structure in which water vapor easily permeates through the back surface side protective film.

As shown in FIG. 8, it was found out that the normalized weather resistance enhances as Ra increases. Further, it was also found out that a high weather resistance is obtained on an area where Ra is greater than 0.5 nm and that weather resistances which are substantially the same are obtained independent of Ra on an area where Ra is greater than 0.5 nm. Incidentally, in any of the structures, the values of weather resistances are the same as or higher than that of a conventional ITO.

Results shown in FIG. 8 are obtained due to the following reasons. To enhance a weather resistance on back surface side, water-resistant property is desired. This is because it is highly likely that moisture permeates through the back surface side protective film after completing the module. Here, adhesive force is generally reduced due to moisture. For this reason, in order to suppress the effects of moisture, what is important is the selection of an adhesive material, the adoption of a module structure in which penetration of moisture is checked and the like. However, the back surface side protective film is generally made of resin, and in that case, the film may deteriorate in a long-term use. Hence, it is expected that penetration of moisture may occur after a long term use. Further, it is also expected that when temperature varies, a collector electrode fixed to a cell (a photovoltaic element) is subjected to a large load caused by the difference in thermal shrinkage occurring between a sealing material and the cell. The sealing material and the collector electrode are made of organic materials, so an adhesive force between them is relatively large. It is hence considered that the load is exerted mainly on a collector electrode and the cell (the transparent conductive film) in which the adhesive force is relatively small. For this reason, it is desirable that the degree of adhesion between the collector electrode and the transparent conductive film be increased. The result of FIG. 7 is assumed to show that the degree of adhesion has increased.

It is considered that the increase of the degree of adhesion is effected because Ra is made large, thereby surface roughness is increased so that an area of adhesion is increased, and because resin of the collector electrode is infiltrated deep into a contacting surface of the transparent conductive film, thus creating an anchor effect. The reason why no difference is found in weather resistances in the cases where Ra is 0.5 or above, is because a factor other than the reduction of a property by an adhesive force between the collector electrode and the cell is dominant. Further, the warp of the cell to be described later is also one of the factors.

FIG. 9 shows a view showing a comparison of outputs of the samples shown in FIG. 8. Here, evaluation is made using not an output Pmax, but $I_{sc}$ (short circuit current)×F.F. (fill factor) which is an index required for the transparent conductive film, and normalization is made with a sample of Ra=1 set to 1.

Here, properties required for the transparent conductive film are high light transmittance and low resistance. The light transmittance has an influence on $I_{sc}$ (short circuit current) of properties of the photovoltaic element, and the higher the light transmittance, the larger the $I_{sc}$. The resistance has an influence on F.F. (fill factor), and the smaller the resistance, the larger the F.F. Accordingly, by setting the value of $I_{sc}$×F.F. as an index, a change in properties of the photovoltaic element due to the transparent conductive film can be evaluated.

As shown in FIG. 9, high outputs are obtained when Ra is low, and particularly, high outputs are obtained when Ra is 1.0 nm or less. Our studies show that excellent films for the property of (high light transmittance×low resistance) are obtained when Ra is low, therefore the above high outputs are obtained. Hence, in order to obtain high outputs, it can be said that it is desirable that Ra of the transparent conductive film on the back surface side be 1.0 nm or less. Accordingly, it is desirable that, in terms of obtaining the weather resistance and the outputs, Ra of the transparent conductive film on the back surface side be from 0.5 to 1.0 nm.

(Evaluation of Arithmetic Mean Roughness (Ra) on a Surface of a Transparent Conductive Film on a Light Receiving Surface Side)

The same above studies have been also conducted on Ra of the transparent conductive films on a light receiving surface side. Ra of the transparent conductive film on the light receiving surface side is changed given that Ra of the transparent conductive film on the back surface side is 1.0 nm that provides excellent performance in the properties of the weather resistance and the outputs.

Figure 10:
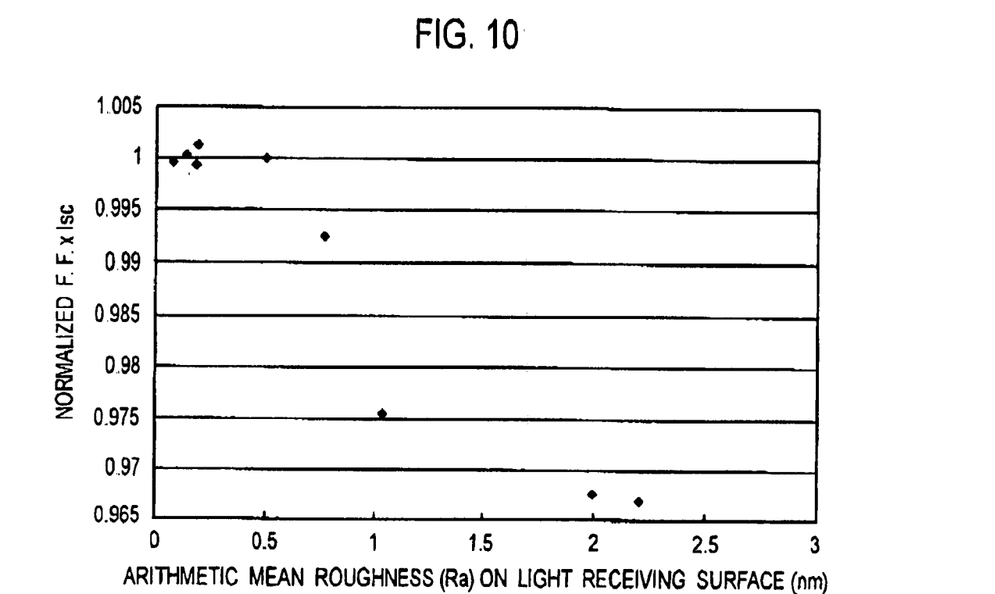
FIG. 10 is a view showing a relationship between $I_{sc} \times F.F$ and an arithmetic mean roughness (Ra) on the surface of the transparent conductive film formed on the light receiving surface of the photovoltaic element according to the example.

Results are shown in FIG. 10. In FIG. 10, normalization is performed for samples with Ra=0.5 nm.

FIG. 10 shows that higher outputs are obtained when Ra is 0.5 mm or less. The output tends to decrease when Ra is greater than 0.5 nm. Therefore, it is desirable that Ra of the transparent conductive film on the light receiving surface be 0.5 nm or less to obtain high outputs. In this range, weather resistances have been also evaluated. Consequently, it was found out that reduction of the weather resistance, shown in FIG. 8, does not occur in the range where Ra is 0.5 nm or less. It was also found out that substantially the same weather resistances are obtained for any value of Ra. In other words, with respect to the sample in which Ra of the transparent conductive film on the back surface is at least 1.0 nm or more so that weather resistance is secured, it was found out that no clear relationship is seen between Ra of the transparent conductive film on the light receiving surface and the weather resistance. Therefore, it was found out that the manufacturing of a structure having an excellent weather resistance on the back surface can enhance the weather resistance of a solar cell module. Consequently, it was found out that it is desirable that Ra of the transparent conductive film on the light receiving surface be one in the range of low Ra on which advantageous outputs are obtained.

(Relationship Between Arithmetic Mean Roughness (Ra) of a Surface of a Transparent Conductive Film on a Back Surface Side and Warp Due to Heat)

Next, on an effect of the transparent conductive film on the back surface side, an influence of warp due to heat has been also studied. A photovoltaic element is put on a hot plate and heated at 150 degrees Celsius for 20 minutes. Evaluations were conducted on two samples, one having the lowest Ra (relatively low weather resistance) used in FIG. 8 and the other having 1.5 nm (excellent weather resistance).

Results by visual observation showed that although no warp was observed for the sample of Ra=1.5 nm, a warp was observed for the sample having the lowest Ra. To be more precise, a warp on the order of 1 to 2 mm was observed for a photovoltaic element of approximately 10 cm square.

From this fact, it is inferred that occurrence of a warp is checked for a sample in which the transparent conductive film on the back surface has a large Ra. It is inferred that once a warp occurs in a photovoltaic element, a load tends to occur between a transparent conductive film and a collector electrode, and a detachment tends to occur due to a reduction of an adhesive force on the back surface in which there is a large quantity of moisture. It is also inferred that the transparent conductive film having the Ra of 0.5 nm or more is made, and thereby, occurrence of a warp is checked, so that high weather resistance is achieved.

What is claimed is:

1. A solar cell module comprising:
a photovoltaic element;
a light receiving surface side protective member disposed above a light receiving surface of the photovoltaic element;
a back surface side protective member disposed above a back surface opposite to the light receiving surface of the photovoltaic element;
the photovoltaic element includes:
a first transparent conductive film which is formed on a first surface facing the back surface side protective member; and
a second transparent conductive film which is formed on a second surface facing the light receiving surface side protective member,
wherein an arithmetic mean roughness (Ra) on a surface of the first transparent conductive film is larger than an arithmetic mean roughness (Ra) on a surface of the second transparent conductive film,
the second transparent conductive film is formed of indium oxide to which tungsten is added,
the arithmetic mean roughness (Ra) of the surface of the second transparent conductive film is 0.5 nm or less, and
the arithmetic mean roughness (Ra) on the surface of the first transparent conductive film is 0.5 nm or more.

2. The solar cell module according to claim 1, wherein the first transparent conductive film mainly contains indium oxide.

3. The solar cell module according to claim 1, wherein the first transparent conductive film is formed of indium oxide to which tungsten is added, and the arithmetic mean roughness (Ra) on the surface of the first transparent conductive film is 1.0 nm or less.

4. The solar cell module according to claim 1, wherein the photovoltaic element further includes:
a one-conductive type crystalline semiconductor layer;
a first substantially intrinsic amorphous semiconductor layer which is formed on a surface of the crystalline semiconductor layer;
an other-conductive type amorphous semiconductor layer which is formed on the first substantially intrinsic amorphous semiconductor layer;
a second substantially intrinsic amorphous semiconductor layer which is formed on another surface of the crystalline semiconductor layer; and
a one-conductive type amorphous semiconductor layer which is formed on the second substantially intrinsic amorphous semiconductor layer, and
the first transparent conductive film is formed on either the other-conductive type amorphous semiconductor layer or the one-conductive type second amorphous semiconductor layer.

* * * * *